United States Patent
Jung et al.

(10) Patent No.: US 11,462,263 B2
(45) Date of Patent: Oct. 4, 2022

(54) BURST-MODE MEMORY WITH COLUMN MULTIPLEXER

(71) Applicant: QUALCOMM Incorporated, San Diego, CA (US)

(72) Inventors: Changho Jung, San Diego, CA (US); Arun Babu Pallerla, San Diego, CA (US); Chulmin Jung, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/131,172

(22) Filed: Dec. 22, 2020

(65) Prior Publication Data

US 2022/0199152 A1    Jun. 23, 2022

(51) Int. Cl.
| | |
|---|---|
| *G11C 11/419* | (2006.01) |
| *G06F 3/06* | (2006.01) |
| *G11C 11/418* | (2006.01) |
| *H03K 19/20* | (2006.01) |
| *H04M 1/02* | (2006.01) |

(52) U.S. Cl.
CPC .......... *G11C 11/419* (2013.01); *G06F 3/0604* (2013.01); *G06F 3/0638* (2013.01); *G06F 3/0679* (2013.01); *G11C 11/418* (2013.01); *H03K 19/20* (2013.01); *H04M 1/0202* (2013.01)

(58) Field of Classification Search
CPC .................................................. G11C 11/419
See application file for complete search history.

(56) References Cited

U.S. PATENT DOCUMENTS

| | | | | |
|---|---|---|---|---|
| 5,850,359 | A * | 12/1998 | Liu | G11C 11/419 365/156 |
| 6,163,475 | A | 12/2000 | Proebsting | |
| 9,570,158 | B1 * | 2/2017 | Mathuria | G11C 7/106 |
| 2007/0115739 | A1 * | 5/2007 | Huang | G11C 11/419 365/203 |
| 2007/0150668 | A1 * | 6/2007 | Kwon | G11C 7/1075 711/149 |
| 2011/0255353 | A1 * | 10/2011 | Fukushima | G01R 31/2874 365/191 |
| 2012/0134226 | A1 * | 5/2012 | Chow | G11C 7/08 365/207 |
| 2016/0005447 | A1 * | 1/2016 | Manning | G06F 9/30 365/189.011 |

FOREIGN PATENT DOCUMENTS

WO    2020247505 A1    12/2020

OTHER PUBLICATIONS

International Search Report and Written Opinion—PCT/US2021/059940—ISA/EPO—dated Feb. 23, 2022.

* cited by examiner

*Primary Examiner* — Min Huang
(74) *Attorney, Agent, or Firm* — Haynes and Boone, LLP

(57) ABSTRACT

A memory is provided that is configured to practice both a normal read operation and also a burst mode read operation. A column multiplexer selects from a plurality of columns using a pair of pass transistor for each column. The column multiplexer drives a true input node and a complement input node of an output data latch.

24 Claims, 5 Drawing Sheets

US 11,462,263 B2

BURST-MODE MEMORY WITH COLUMN MULTIPLEXER

TECHNICAL FIELD

This application relates to memories, and more particularly to a burst-mode memory with a column multiplexer.

BACKGROUND

A burst-mode static random-access memory (SRAM) does not multiplex each sense amplifier across a group of columns because each column needs to latch a bit decision prior to a burst-mode read operation. Since each column in a burst-mode SRAM has its own sense amplifier that latches a data bit, it is conventional to multiplex the data bits from the sense amplifiers for a group of columns through a column multiplexer during a burst-mode read operation. The column multiplexer selects from the columns according to the column address and drives the data bit to an output data latch. To perform this selection typically requires not only the decoded column address bits but also the complement of the decoded column address bits. The toggling of so many address signals consumes power and also requires a corresponding number of transistors in the column multiplexer. In addition, the output data latch is typically clocked such that a delayed clock signal is required to provide an adequate hold time but at the cost of a slower operating speed.

SUMMARY

In accordance with a first aspect of the disclosure, a burst-mode memory is provided that includes: a plurality of columns, each column including a sense amplifier configured to sense a bit decision to drive a bit decision node and a complement bit decision node for the column; an output data latch having a true input node and a complement input node; and a column multiplexer having a plurality of pairs of pass transistors, each pair of pass transistors including a first pass transistor coupled between a respective column's bit decision node and the true input node and including a second pass transistor coupled between the respective column's complement bit decision node and the complement input node.

In accordance with a second aspect of the disclosure, a method for a burst-mode memory is provided that includes: during a random-read operation to a plurality of columns, latching a bit signal and a complement bit signal in a sense amplifier in each column; during a first burst-mode read operation to a first one of the columns following the random read operation, switching on a first pair of pass transistors to pass the bit signal from the first one of the columns to a true input node of an output data latch and to pass the complement bit signal from the first one of the columns to a complement input node of the output data latch; and latching the bit signal from the first one of the columns in the output data latch responsive to the switching on of the first pair of pass transistors.

In accordance with a third aspect of the disclosure, a burst-mode memory is provided that includes: a first column having a first sense amplifier configured to sense a first bit signal and a complement first bit signal; a second column having a second sense amplifier configured to sense a second bit signal and a second complement bit signal; an output data latch having a true input node and a complement input node; and a column multiplexer including a first pair of pass transistors configured to pass the first bit signal to the true input node and to pass the first complement bit signal to the complement input node in response to an assertion of a first decoded column address signal and including a second pair of pass transistors configured to pass the second bit signal to the true input node and to pass the second complement bit signal to the complement input node in response to an assertion of a second decoded column address signal.

These and additional advantages may be better appreciated through the following detailed description.

BRIEF DESCRIPTION OF THE DRAWINGS

Embodiments of the present disclosure and their advantages are best understood by referring to the detailed description that follows. It should be appreciated that like reference numerals are used to identify like elements illustrated in one or more of the figures.

DETAILED DESCRIPTION

Figure 1:
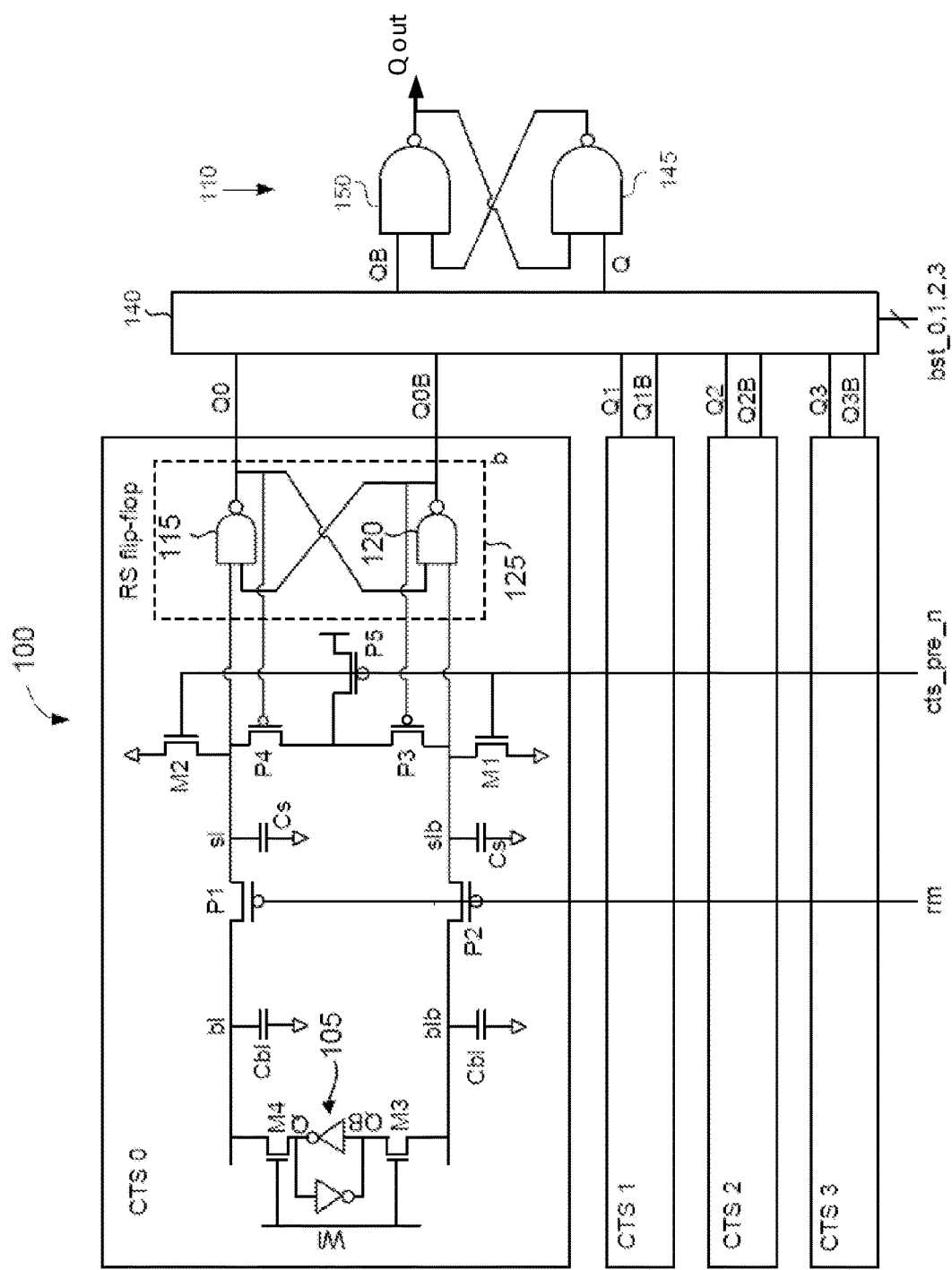
FIG. 1 illustrates a burst-mode memory including a column multiplexer and an output data latch in accordance with an aspect of the disclosure.

An improved column multiplexer is provided for a burst-mode SRAM. The column multiplexer responds to a decoded column address without requiring a complement decoded column address signal. In addition, the column multiplexer drives an asynchronous output data latch so there is no need for a delayed clock signal to improve the hold time for the output data latching. The column multiplexer may be implemented in any suitable burst-mode SRAM but a particularly advantageous burst-mode SRAM is disclosed herein in combination with the column multiplexer. Operation of this advantageous burst-mode SRAM may be better appreciated through a consideration of a conventional burst-mode read operation.

Prior to a burst-mode read operation, a normal mode (random) read operation to a particular row occurs. Since each column has a latching sense amplifier, each sense amplifier latches a bit decision from a read operation to a bitcell at an intersection of the accessed row with sense amplifier's column. This random read operation consumes an appreciable amount of power with regard to the assertion of the word line for the accessed row, the discharging of a precharged bit line in each column, and the latching within each sense amplifier. But should a read operation again occur to the same row without any intervening write operation to the row, the read operation may be a burst-mode read operation as compared to a random read operation. In the burst-mode read operation, the word line is not asserted nor are any of the bit lines discharged so there is no power consumed with regard to asserting the word line or discharging any of the bit lines. In addition, since each sense amplifier has already latched a bit decision, the sense amplifiers consume substantially less power as compared to a normal-mode read operation. The column multiplexer need only select from the sense amplifiers according to the decoded column address signal during a burst-mode read operation and retrieve the bit decision from the corresponding sense amplifier.

Although any suitable burst-mode SRAM may be integrated with the disclosed column multiplexer, the following discussion will be directed to a charge-transfer burst-mode SRAM that advantageously reduces power consumption and simplifies the sense amplifier design. Like any conventional SRAM, a bit line voltage difference for a column's bit line pair during a random read operation in a charge-transfer burst-mode SRAM is not full rail but instead equals a fraction of the power supply voltage. A conventional SRAM sense amplifier requires gain to amplify this partial bit line voltage difference into a "full rail" bit decision that either equals the power supply voltage or ground. A conventional SRAM sense amplifier is thus relatively bulky such that the column pitch would have to be correspondingly large to accommodate each column having its own sense amplifier. The charge-transfer burst-mode memory disclosed herein enables each column to have a compact sense amplifier such as a set-reset flip-flop implemented by a pair of cross-coupled logic gates (for example, a pair of cross-coupled NAND gates).

Prior to a random read operation, the bit line pairs for the columns are pre-charged to a memory power supply voltage. A clock signal then triggers a self-timed clock circuit to assert a word line for an addressed one of the rows. The asserted word line switches on the access transistors in the row's bitcells so that the bitcells in the addressed row can affect the pre-charged state of the corresponding bit line pairs. Depending upon the binary content of the addressed bitcells, one of the bit lines in each bit line pair will be discharged slightly below the memory power supply voltage while a second bit line in each bit line pair remains charged to the memory power supply voltage.

Each column has its own sense amplifier that latches a bit decision based upon the voltage difference developed across the column's bit line pair when the word line voltage is asserted. The columns may be arranged into groups of multiplexed columns. Each group of multiplexed columns includes a column multiplexer that selects from the group's sense amplifiers to drive an output data latch. The selection by the column multiplexer depends upon the column address. Each sense amplifier includes a pair of sense amplifier nodes for coupling to the column's bit lines during a sense enable period in a random read operation. The sense amplifier nodes are precharged prior to the random read operation although this pre-charging may be a discharge to ground as compared to the pre-charging of the bit lines to the power supply voltage. A random read operation ends with the column multiplexer selecting for the bit decision from the addressed column/sense amplifier so that the bit decision may be latched in the output data latch.

Whether a consecutive read operation is another random read operation or a burst-mode read operation depends in part upon whether the address for the consecutive read operation is directed to the same row. Note that during the random read operation, each sense amplifier in the addressed group of multiplexed columns latched a bit decision. A burst-mode read operation may be activated if the same row is addressed as was addressed in the preceding random read operation so long as no intervening write operations occur to the same row. In this fashion, the latched bit decisions from the preceding random read operation are utilized in the burst-mode read operation without requiring the word line to be re-asserted. Similarly, the bit lines are not pre-charged nor are the sense amplifier nodes pre-charged during a burst-mode read operation so as to reduce power consumption.

Prior to the burst-mode read operation, a random read operation should occur so that the sense amplifiers latch their bit decisions. Once the random read operation occurs, a burst-mode read operation may be invoked again and again so long as the same row is being addressed as was addressed in the preceding random read operation (assuming that there is no intervening write to this row). For example, suppose that that four columns are multiplexed and that an initial random read operation occurs to a first column from the four columns. If a consecutive read operation is directed to the same row without any intervening write operation to the same row, a burst-mode read operation may occur. For example, a second column from the four columns may be read in a first burst-mode read operation. A third column from the four columns may then be read in a second burst-mode read operation, and so on. The word line, the bit lines, and the sense amplifier nodes are not precharged during the burst-mode read operations, which substantially reduces power consumption.

In a charge-transfer burst-mode SRAM, density is not hindered by a lack of multiplexing a single sense amplifier across multiple columns because of a charge-transfer operation that is achieved through the control of charge-transfer transistors. Each bit line for a column couples to a sense amplifier node for the column's sense amplifier through a corresponding charge-transfer transistor. A source of each charge-transfer transistor couples to its bit line whereas a drain of each charge-transfer transistor couples to its sense amplifier node. The gate-to-source voltage for each charge-transfer transistor is thus determined by its gate voltage and its bit line voltage. The following discussion will assume that each charge-transfer transistor is a p-type metal-oxide semiconductor (PMOS) transistor but it will be appreciated that a charge transfer may also be accomplished with n-type metal-oxide semiconductor (NMOS) transistors.

Prior to the word line assertion for the initial random read operation, the bit lines are pre-charged to a power supply voltage whereas the sense amplifier nodes are all discharged. The word line is then asserted for a word line assertion period during which a bit line voltage difference develops for each bit line pair that depends upon the bit stored in each bitcell at the intersections of the word line and the bit line pairs for the group of multiplexed columns. Depending upon this bit, either a true bit line or a complement bit line in each bit line pair is discharged slightly from the pre-charged state (the power supply voltage). The resulting bit line voltage difference is not full rail but instead is just a fraction of the power supply voltage (e.g., approximately 100 mV). To form a bit decision from such a relatively-small bit line difference traditionally requires a high-gain sense amplifier. But the charge-transfer technique discussed herein results in an amplification of the bit line voltage difference across the pair of sense nodes for a bit line pair. Due to this amplification, a sense amplifier does not need high gain but instead may be implemented by a reset-set (RS) latch that is relatively dense and has a relatively low power consumption. Each column may thus have its own sense amplifier.

The charge transfer occurs during a charge-transfer period that begins near an end of the word line assertion period. Prior to the charge-transfer period, the gate voltage for each charge-transfer transistor is maintained at the power supply voltage so that each charge-transfer transistor is off. The charge-transfer period is delayed with respect to the assertion of the word line so that the bit line voltage difference may develop for each bit line pair. During the charge-transfer period, the gate voltage for the charge-transfer transistors is dropped from the power supply voltage at some slew rate towards ground. For example, a relatively small inverter or the dummy bit line voltage may be used to control the gate voltage for the charge-transfer transistors. Depending upon the bit value being read, either the true bit line or the complement bit line in each bit line pair will drop slightly from its pre-charged state (the power supply voltage). This bit line is referred to in the following discussion as the partially-charged bit line. But the remaining bit line in each bit line pair will remain charged to the power supply voltage. This bit line is referred to as the fully-charged bit line in the following discussion.

The gate voltage for each charge-transfer transistor in the group of multiplexed columns is dropped during the charge-transfer period so that the gate-to-source voltage (the gate-to-bit-line voltage) of the charge-transfer transistor for the fully-charged bit line satisfies its threshold voltage. But the reduction in voltage of the partially-charged bit line is such that this same gate voltage does not satisfy the threshold voltage of the charge-transfer transistor for the partially-charged bit line. Thus, only the charge-transfer transistor of the fully-charged bit line in a bit line pair will initially conduct charge to its sense node. The capacitance of the sense node may be relatively small compared to the capacitance of the bit line so the resulting charge transfer causes the sense node to be nearly charged to the power supply voltage. In contrast, the sense node for the partially-discharged bit line remains in its discharged default state such that the voltage difference between the sense nodes for an accessed bit line pair is nearly full rail (a voltage difference nearly equaling the power supply voltage). The charge transfer has thus resulted in an amplification of the relatively minor bit line voltage difference into a nearly-full-rail voltage difference on the sense nodes such that the sense amplifier may be a relatively compact and low-power RS latch such as formed by a pair of cross-coupled NAND gates. The sensing by the sense amplifier occurs in a sense enable period.

An example charge-transfer burst-mode SRAM 100 with a column multiplexer 140 is shown in FIG. 1. As will be explained further herein, column multiplexer 140 selects from a group of multiplexed columns (in one implementation, four columns) responsive to a set of decoded column address signals to drive an output data latch 110. Due to the decoding of the column address signals, there is a decoded column address signal bst_0 that selects for a zeroth column CTS 0. Similarly, there is a decoded column address signal bst_1 that selects for a first column CTS 1, a decoded column address signal bst_2 that selects for a second column CTS 2, and a decoded column address signal bst_3 that selects for a third column CTS 3. Each decoded column address signal is a one-bit signal that, when asserted, controls column multiplexer 140 to select for the corresponding column. As defined herein, a one-bit signal is deemed to be asserted (or equivalently, to be set) when the signal has a logic true value, regardless of whether the logic true state is represented by an active-high or an active-low convention. Conversely, a signal is deemed herein to be de-asserted or "reset" when the signal has a logic false state, regardless of whether an active high or active low convention is used. In an active-high convention, each decoded column address signal is asserted by being charged to a power supply voltage. The following discussion will assume without loss of generality that the decoded column address signals use a logic-high convention. In each burst-mode read operation, only one of the decoded column address signals is asserted while the remaining decoded column address signals remain discharged. But note that column multiplexer 140 does not need any complements of the decoded column address signals. This is quite advantageous with respect to decreasing complexity and also power consumption.

Each column includes its own bit line pair. For example, a true bit line bl and a complement bit line blb traverse the zeroth column. A bitcell 105 lies at an intersection of the zeroth column and a word line wl. Bitcell 105 includes a pair of cross-coupled inverters. The output node of a first one of the inverters is the true (Q) output for bitcell 105. This output node couples to the bit line bl through an NMOS access transistor M4. Similarly, the output node of a remaining second one of the inverters is the complement (QB) output for bitcell 105 that couples to the complement bit line blb through an NMOS access transistor M3. The word line wl couples to the gates of the access transistors so that the Q and QB nodes drive their respective bit lines during a word line assertion period.

Each of the remaining columns includes an analogous bitcell at the column's intersection with word line wl. Since these additional columns are analogous to the zeroth column, only the zeroth column is shown in detail in FIG. 1. Prior to the word line assertion period during a random read operation, bit lines bl and blb in each column were pre-charged to the power supply voltage. Such pre-charging of the bit lines is conventional and thus the details for this pre-charging are not illustrated in FIG. 1. Following the bit line pre-charging, the bit lines float. In the zeroth column, bit line bl couples to a corresponding sense node sl for a sense amplifier 125 through a PMOS charge-transfer transistor P1. Similarly, complement bit line blb couples a to a corresponding sense node slb through a PMOS charge-transfer transistor P2. Prior to the word line assertion, a gate voltage rm for the charge-transfer transistors is charged to the power supply voltage to prevent any charge transfer to the sense nodes. In a random read operation, a sense node pre-charge signal (cts_pre_n) is asserted to a power supply voltage prior to the word line assertion. The charged sense node pre-charge signal drives the gates of an NMOS transistor M1 and an NMOS transistor M2. The sources of transistors M1 and M2 are tied to ground whereas their drains are tied to complement sense node slb and sense node sl, respectively. The assertion of the sense node pre-charge signal will thus discharge both the sense node sl and the sense node slb for the first column since both transistors M1 and M2 are switched on to couple their respective bit lines to ground. As noted earlier, the additional columns have the same structure as shown for the zeroth column.

All the columns will thus have their sense nodes discharged and their bit lines pre-charged prior to the word line assertion period for a random read operation. But if a consecutive read operation is directed to the same word line and group of columns, a burst-mode read operation occurs. During a random read operation, the switching on of the access transistors M4 and M3 by the assertion of the word line voltage causes one of the bit lines bl or blb to discharge slightly from its pre-charged state depending upon the binary content stored in bitcell 105. This slight bit line discharge is amplified by the charge-transfer period during which charge-transfer transistors P1 and P2 are switched on as follows. The charge-transfer period is triggered by the discharge of gate voltage rm. This discharge of the gate voltage rm begins while the word line voltage is still asserted. The discharge of the gate voltage rm may end after the word line voltage has been discharged. The discharge of the gate voltage rm has some slope or slew rate to it. Due to this less-than-instantaneous discharge of the gate voltage rm, the gate voltage rm will discharge to the threshold voltage for the charge-transfer transistor having its source tied to the fully-charged bit line but will still be above the threshold voltage for the charge-transfer transistor having its source tied to the partially-discharged bit line. The charge-transfer transistor for the fully-charged bit line will thus conduct charge to its sense node prior to when the other charge-transfer transistor conducts charge from the partially-discharged bit line. For example, suppose that bit line bl is the fully-charged bit line such that charge-transfer transistor P1 begins conducting before charge-transfer transistor P2. The sense node voltage sl will thus increase prior to the increase of the complement sense node voltage slb.

Sense amplifier 125 is formed by a cross-coupled pair of NAND gates as discussed earlier. Sense node sl is connected to an input of a NAND gate 115 in sense amplifier 125. Similarly, sense node slb ties to an input of a NAND gate 120 in sense amplifier 125. NAND gates 115 and 120 are cross-coupled to form an RS latch. The pre-charging to zero volts of the sense nodes causes both outputs of NAND gates 115 and 120 to be asserted high to the power supply voltage. The capacitance of the sense nodes as conceptually represented by capacitors Cs is relatively small as compared to the bit line capacitance as conceptually represented by capacitors Cbl. The brief amount of time in which charge-transfer transistor P1 begins conducting before charge-transfer transistor P2 conducts thus causes a significant increase in the voltage of sense node sl as compared to sense node slb. This increase in voltage exceeds the threshold voltage for NAND gate 115 such that its output is discharged to zero. The zero output of NAND gate 115 reinforces the binary high output of NAND gate 120 so that the binary one value stored in bitcell 105 is latched in sense amplifier 125. The output of NAND gate 115 in sense amplifier 125 forms a data output signal Q0 for the zeroth column. Similarly, the output of NAND gate 120 forms a complement data output signal Q0B. The sense amplifiers in the remaining columns are analogous but are not shown for illustration clarity. There is thus a data output signal Q1 and a complement data output signal Q1B from the sense amplifier in the first column (CTS 1), a data output signal Q2 and its complement Q2B from the sense amplifier in the second column (CTS 2), and a data output signal Q3 and its complement Q3B from the sense amplifier in the third column (CTS 3).

The output data latch 110 may be implemented using a pair of cross-coupled NAND gates 145 and 150 as discussed analogously with regard to sense amplifier 125. Column multiplexer 140 functions to couple the data output signal from the selected column to a true (Q) input node to NAND gate 145. Similarly, column multiplexer 140 couples the complement data output signal from the selected column to a complement (QB) input node to NAND gate 150.

To assist the latching within sense amplifier 125 during a random read operation, the sense node pre-charge signal drives a gate of a PMOS transistor P5 having its source tied to a power supply node for the power supply voltage. The drain of transistor P5 connects to the sources of a pair of PMOS transistors P4 and P3. The drain of transistor P4 is tied to the sense node sl whereas the drain of transistor P3 is tied to the complement sense node slb. The output of NAND gate 115 drives the gate of transistor P4. Similarly, the output of NAND gate 120 drives the gate of transistor P3. For example, suppose that the output of NAND gate 115 is low. This low output switches on transistor P4 to reinforce the fully-charged state of sense node sl, which in turn reinforces the zero output for NAND gate 115. Conversely, suppose that the output of NAND gate 120 is low following a sense enable period. Transistor P3 would then be switched on. The switching on of transistor P3 reinforces the fully-charged state of complement sense node slb, which in turn reinforces the zero output of NAND gate 120. In this fashion, the latching of the sensed bit in sense amplifier 125 is strengthened or reinforced. The additional columns may be implemented accordingly to also strengthen their sense amplifier latching.

Figure 2:
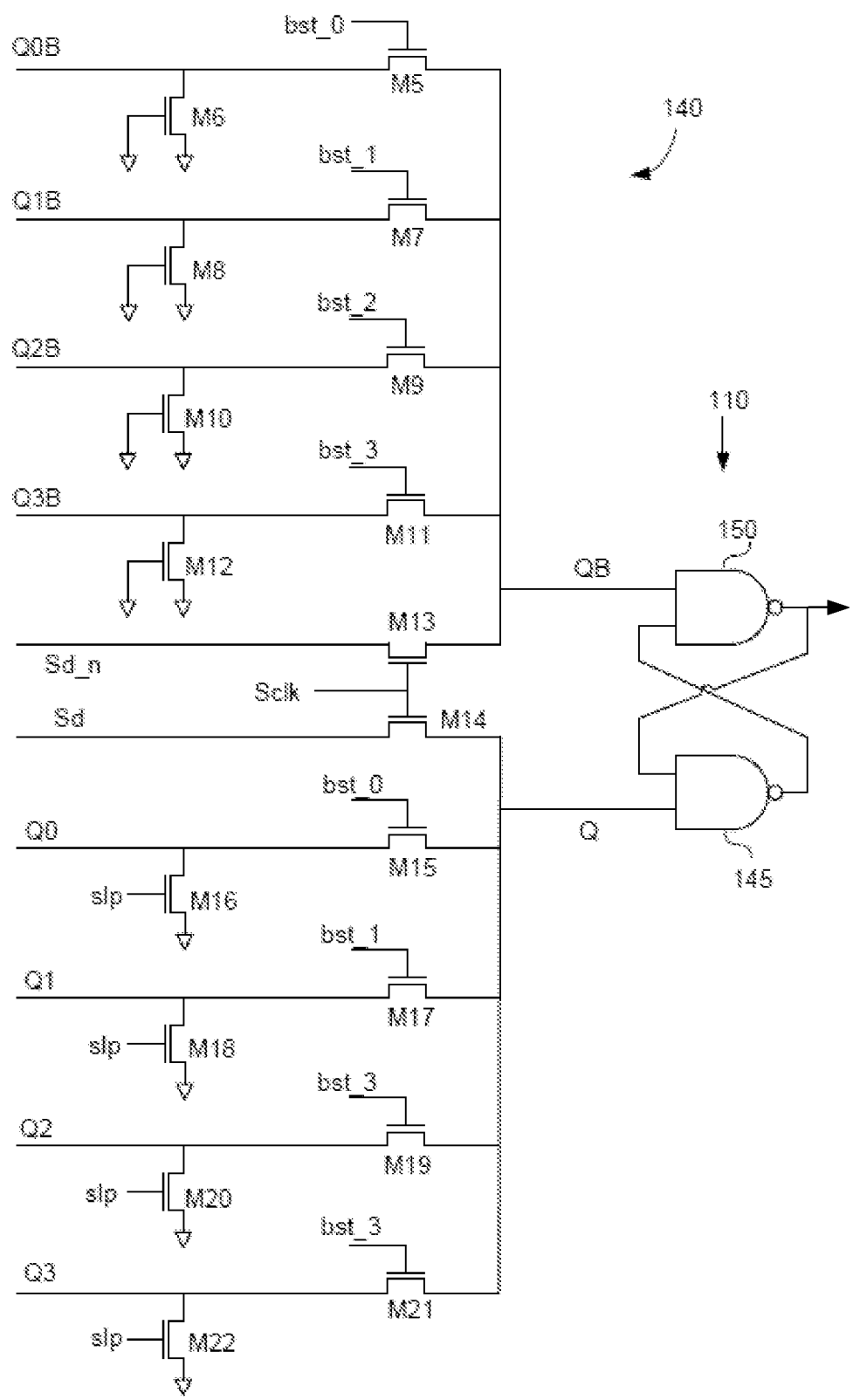
FIG. 2 is a circuit diagram of a column multiplexer and an output data latch in accordance with an aspect of the disclosure.

It will be appreciated that the burst mode operation disclosed herein is not limited to any particular column multiplexing size. For example, column multiplexer 140 may select from a pair of columns, from a set of eight columns, or from a set of sixteen columns, and so on in alternative implementations. Column multiplexer 140 is shown in more detail in FIG. 2. Each bit signal and its complement is received by its own NMOS pass transistor. For example, the bit signal Q0 from the zeroth column (FIG. 1) is received by an NMOS pass transistor M15 whereas the complement bit signal Q0B from the zeroth column is received by an NMOS complement pass transistor M5. The decoded column address signal (bst_0) for the zeroth column drives a gate of both pass transistors M15 and M5.

Pass transistor M15 couples between a node for the bit decision Q0 and a Q input node to NAND gate 145. Similarly, pass transistor M5 couples between a node for the complement bit decision Q0B and a complement QB input node to NAND gate 150. If the zeroth column is selected (the decoded column address signal bst_0) being asserted), both pass transistors M15 and M5 will be switched on. Depending upon the bit that was latched in the sense amplifier 125 for the zeroth column, one of the signals Q0 and Q0B will be charged to the power supply voltage while the remaining signal is grounded. For example, suppose that signal Q0 is grounded. The switching on of pass transistor M15 thus grounds the Q input node to NAND gate 145 in that case. This forces the output signal of NAND gate 145 to be asserted such that both inputs to NAND gate 150 are asserted, which forces the output signal of NAND gate 150 low. The binary low state of the Q0 signal is thus latched in output data latch 110. The output of NAND gate 150 forms a data output (Q out) for output data latch 110. If signal Q0B is grounded while the zeroth column is addressed, the output of NAND gate 150 is asserted. Since both inputs to NAND gate 145 are then asserted, the output of NAND gate 145 is discharged to latch the binary high state of the Q0 signal in output data latch 110. The Q out signal in that case would be asserted high accordingly by NAND gate 150.

All the remaining columns are analogous in that there is one pass transistor for coupling the column's bit decision to the Q input node of NAND gate 145 and another pass transistor for coupling the column's complement bit decision to the QB input node of NAND gate 150. For example, the first column is selected for by a pair of NMOS pass transistors M17 and M7. Pass transistor M17 couples between a node for the bit signal Q1 and the Q input node to NAND gate 145. Pass transistor M7 couples between a node for the complement bit signal Q1B and the QB input node to NAND gate 150. The decoded column address signal bst_1 drives the gates of pass transistors M7 and M17. Similarly, column multiplexer 140 includes a pair of NMOS pass transistors M19 and M9 to select for the second column. Pass transistor M19 couples between a node for the bit signal Q2 and the Q input node to NAND gate 145. Pass transistor M9 couples between a node for the complement bit signal Q2B and the QB input node to NAND gate 150.

The decoded column address signal bst_2 drives the gates of pass transistors M9 and M19. Column multiplexer 140 also includes a pair of NMOS pass transistors M21 and M11 to select for the third column. Pass transistor M21 couples between a node for the bit signal Q3 and the Q input node to NAND gate 145. Pass transistor M11 couples between a node for the complement bit signal Q3B and the QB input node to NAND gate 150. The decoded column address signal bst_3 drives the gates of pass transistors M11 and M21.

To select for any particular column, the decoded column address signal for that column is asserted while all the remaining decoded column address signals are de-asserted. Depending upon the binary state for the bit decision in the selected column, either the Q input node or the QB input node to output data latch 110 will then be grounded while the remaining input node remains asserted. The output of the NAND gate with the grounded input node will then be asserted whereas the output of the remaining NAND gate will be de-asserted to latch the bit decision in output data latch 110.

Referring again to FIG. 1, note that the status of signals is generally undefined at power-up or during a sleep mode. There may thus be a direct current (DC) path to ground from a power supply voltage node in NAND gates 115 and 120 in sense amplifier 125. A similar DC path may exist in the corresponding NAND gates in the other column's sense amplifiers. In particular, each NAND gate includes a pair of NMOS transistors that couple in series from the NAND gate's output node to ground and also include a pair of PMOS transistors that couple in parallel from the gate's output node to the power supply voltage node. If their levels are uncontrolled during power-on, the input signals to the gates of these transistors could be driven to a mid-level voltage between ground and the power supply voltage such that the PMOS and NMOS transistors are all partially on to establish a DC path. To cut off these DC paths, the signal nodes for the bit decisions driving column multiplexer 140 are grounded during a sleep mode or during a power-on-reset period by the assertion of a sleep signal (slp) that switches on a corresponding NMOS transistor for each bit decision node. For example, the node for the bit decision Q0 may couple to ground through an NMOS transistor M16. Similarly, an NMOS transistor M18 couples between the node for the bit decision Q1 and ground. In the same fashion, an NMOS transistor M20 couples between the node for the bit decision Q2 and ground. Finally, an NMOS transistor M22 couples between the node for the bit decision Q3 and ground. The sleep signal drives the gates of transistors M16, M18, M20 and M22 during the power-on reset period (or during a sleep mode) so that the bit decision nodes are all grounded. This grounding of each bit decision node causes the corresponding NMOS transistor in each NAND gate 120 to be off to cut off each corresponding potential DC path. This logical zero input signal to NAND gate 120 causes the cross-coupled input to each NAND gate 115 to be asserted. Since the bit lines are also asserted during the power-on reset period, both PMOS transistors in each NAND gate 115 are switched off to also cut off the corresponding potential DC path. It may thus be appreciated that so long as one input to a NAND gate is grounded (or all its inputs asserted), the potential DC path for that NAND gate is cut off. Although it is sufficient to ground the bit decision nodes, the complement bit decision nodes also have corresponding NMOS transistors so that the capacitive loading is balanced. For example, the node for the complement bit decision Q0B couples to an NMOS transistor M6. Similarly, the node for the complement bit decision Q1B couples to an NMOS transistor M8. In addition, the node for the complement bit decision Q2B couples to an NMOS transistor M10. Finally, the node for the complement bit decision Q3B couples to an NMOS transistor M12. The gates of transistors M6, M8, M10, and M12 are grounded as there is no need to ground both the bit decision and the complement bit decision nodes during the power-on reset period. In an alternative implementation, the sleep signal may also drive the gates of transistors M6, M8, M10, and M12 although this is unnecessary to assure that the DC paths are cutoff during the power-on reset periods (or during a sleep mode of operation).

To make column multiplexer 140 compatible with a scan mode of operation for diagnostics, a scan signal Sd may pass through an NMOS pass transistor M14 to drive the Q input node of NAND gate 145. Similarly, a complement scan signal Sd_n may pass through an NMOS pass transistor M13 to drive the QB input node of NAND gate 150. During the scan mode of operation, a scan clock signal (Sclk) drives the gate of pass transistors M13 and M14 to switch them on and allow the scan signal to be latched in output data latch 110.

Column multiplexer 140 uses only one polarity of the address signals. In an alternative implementation, the NMOS pass transistors that couple the bit decisions to the Q input node and the complement bit decisions to the QB input node may be replaced by PMOS pass transistors. In a PMOS pass transistor implementation, cross-coupled NAND gates 145 and 150 in output data latch 110 would be replaced by cross-coupled NOR gates. A set of complement decoded address signals would drive the gates of the PMOS pass transistors to select for a column. Regardless of whether an NMOS or a PMOS pass transistor implementation is used, the resulting column multiplexer needs only one polarity (true or complement) of the decoded column address signals to control the pass transistors. This reduces power consumption as compared to conventional column multiplexing such as through the use of tri-state inverters that require both polarities of the decoded column address signals. In addition, the output data latch needs no clocking with regard to the driving of its Q and QB input nodes by the column multiplexer so that operation speed is not hindered by the need to delay the output clock latching to provide a sufficient data hold margin. During consecutive burst-mode read operations, the column multiplexer may then select from the columns to drive the output latch with the bit decisions with increased speed and reduced power consumption.

Figure 3:
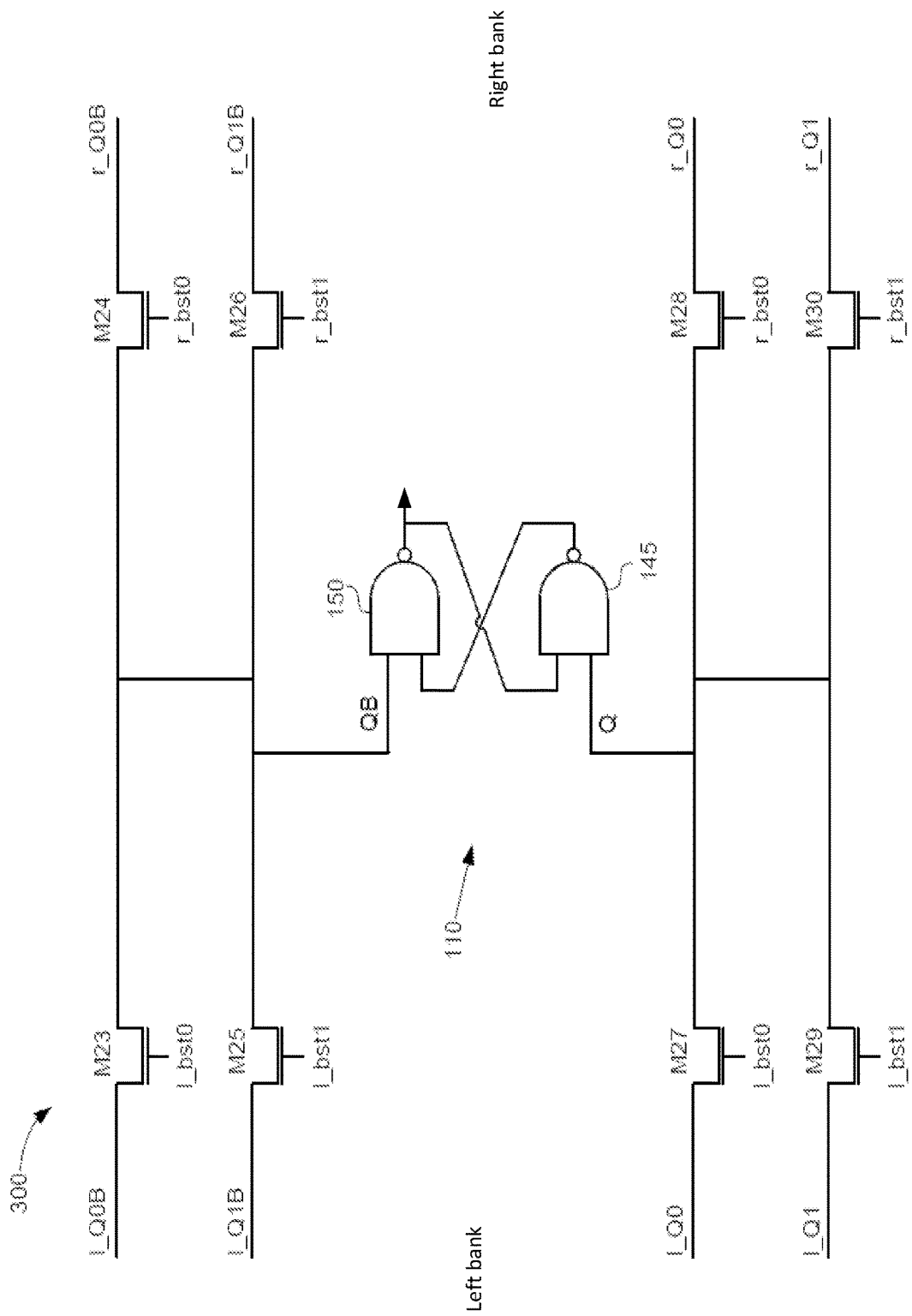
FIG. 3 is a circuit diagram of a column multiplexer and an output data latch in a multi-bank burst-mode memory in accordance with an aspect of the disclosure.

A column multiplexer 300 for the multiplexing of the sense amplifier bit decisions from a multi-bank burst-mode SRAM is shown in FIG. 3. For illustration clarity, only two columns for a left bank and a right bank are illustrated. As used herein, a "bank" refers to an array of columns. A two-bank memory thus has two separate arrays of columns. For illustration clarity, column multiplexer 300 is shown receiving only the output signals from a zeroth column and a first column in each bank. The bit decision from the left bank's zeroth column is denoted as l_Q0 and its complement bit decision is denoted as l_Q0B. The right bank's zeroth column signals are analogously denoted as r_Q0 and r_Q0B. Similarly, the bit decision from the left bank's first column is denoted as l_Q1 and its complement bit decision is denoted as l_Q1B. The right bank's first signals are analogously denoted as r_Q1 and r_Q1B.

The bit decisions pass through NMOS pass transistors to the Q input of output data latch 110, which is arranged as discussed with regard to FIG. 1. The complement bit decisions pass through NMOS pass transistors to the QB input of output data latch 110. For example, a pass transistor M27 passes the left bank's zeroth column's signal l_Q0 to the Q input node. A pass transistor M23 passes the corresponding complement bit decision to the QB input node. The remaining columns are analogous in that the zeroth column in the right bank is selected for by a pass transistor M28 and a pass transistor M24. Similarly, the left bank's first column is selected for by a pass transistor M29 and a pass transistor M25. Finally, the right bank's first column is selected for by a pass transistor M30 and a pass transistor M26. Each column has its own decoded column address signal. For example, the assertion of a decoded column address signal l_bst0 switches on the pass transistors M23 and M27 to select for the left bank's zeroth column. Similarly, the assertion of a decoded column address signal l_bst1 switches on the pass transistors M25 and M29 to select for the left bank's first column. The right bank is analogous in that a decoded column address signal r_bst0 drives the gates of pass transistors M24 and M28 to select for the right bank's zeroth column. Similarly, a decoded column address signal r_bst1 drives the gates of pass transistors M30 and M26 to select for the right bank's first column.

Figure 4:
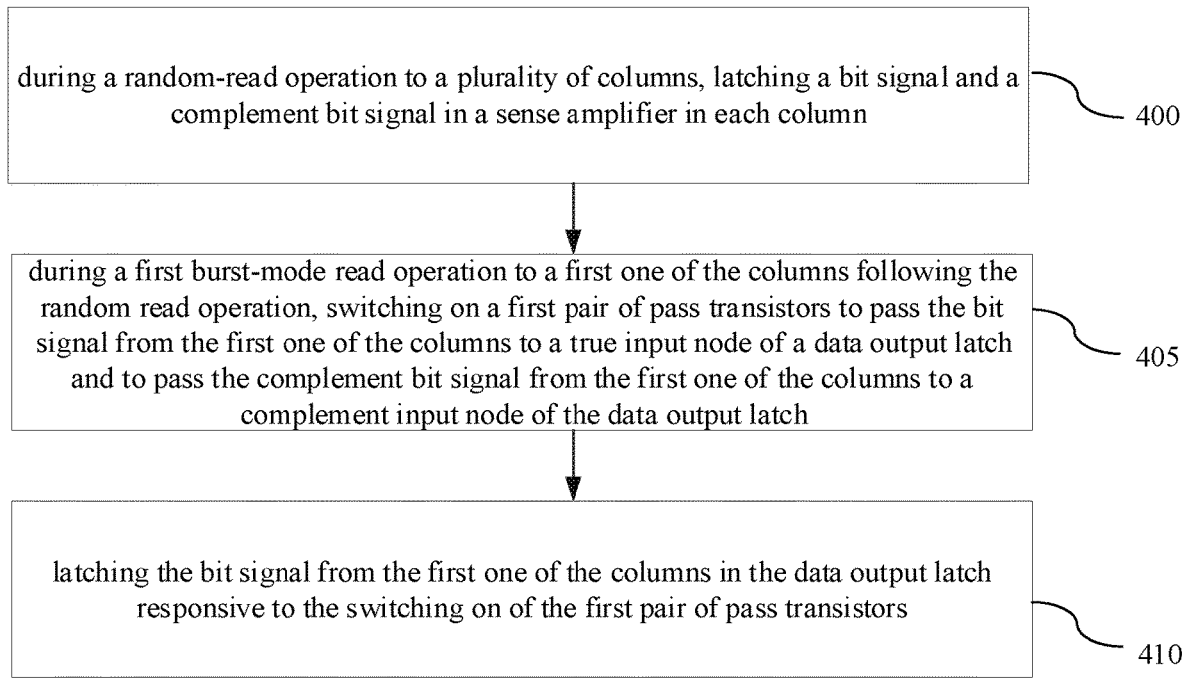
FIG. 4 is a flowchart of a method of operation for a burst-mode memory in accordance with an aspect of the disclosure.

A method for a burst-mode memory will now be discussed with reference to the flowchart of FIG. 4. The method includes an act 400 that occurs during a random-read operation to a plurality of columns and includes latching a bit signal and a complement bit signal in a sense amplifier in each column. The latching of a bit decision in each column in SRAM 100 is an example of act 400. In that regard, the terms "bit decision" and "bit signal" are used interchangeably herein. The method also includes an act 405 that occurs during a first burst-mode read operation to a first one of the columns following the random read operation and includes switching on a first pair of pass transistors to pass the bit signal from the first one of the columns to a true input node of an output data latch and to pass the complement bit signal from the first one of the columns to a complement input node of the output data latch. The switching on a column's pair of pass transistors in column multiplexer 140 during a burst-mode read operation is an example of act 405. The method further includes an act 410 of latching the bit signal from the first one of the columns in the output data latch responsive to the switching on of the first pair of pass transistors. The latching of the bit decision in output data latch 110 as selected for by column multiplexer 140 is an example of act 410.

Figure 5:
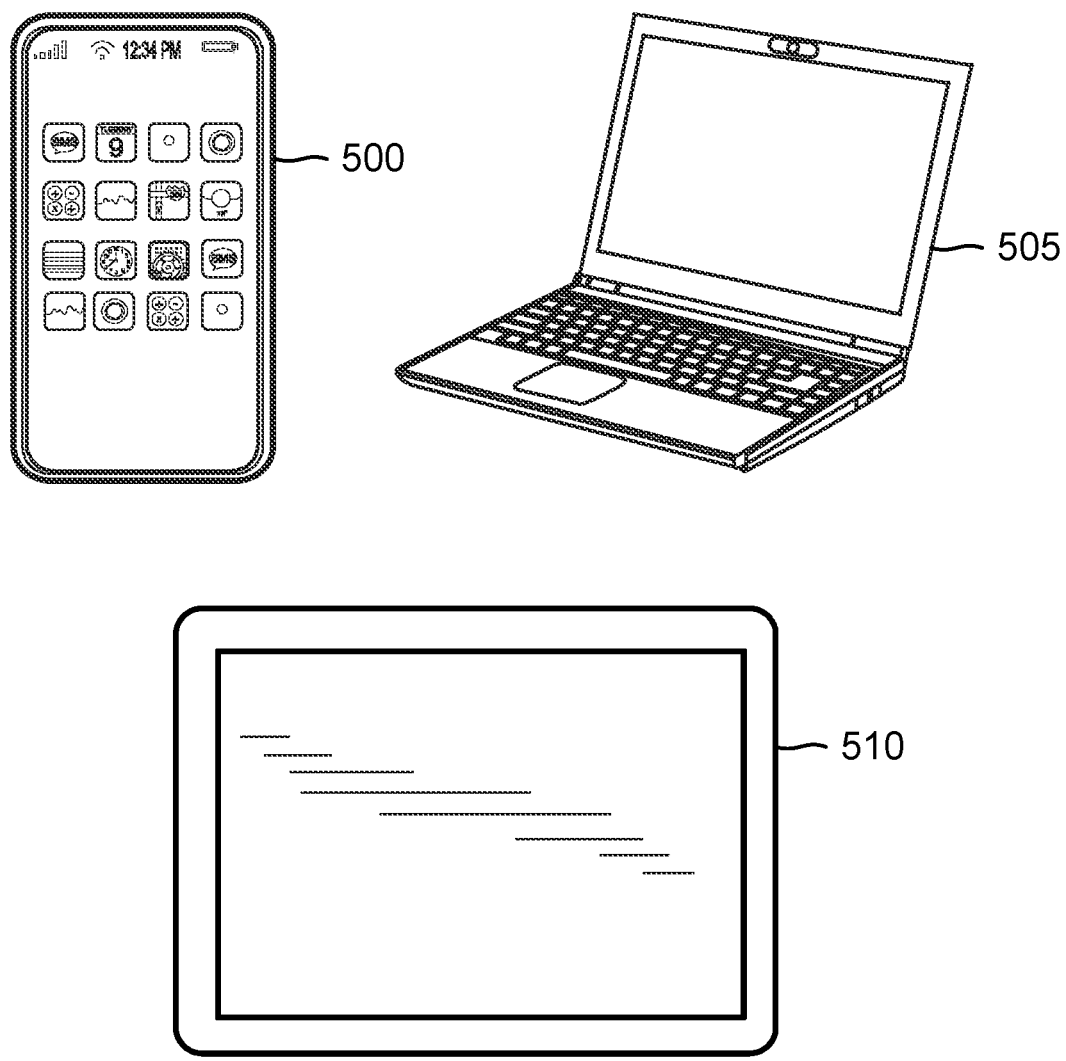
FIG. 5 illustrates some example electronic systems each incorporating a burst-mode memory in accordance with an aspect of the disclosure.

A burst-mode memory with a column multiplexer and output data latch as disclosed herein may be incorporated into a wide variety of electronic systems. For example, as shown in FIG. 5, a cellular telephone 500, a laptop computer 505, and a tablet PC 510 may all include a burst-mode memory in accordance with the disclosure. Other exemplary electronic systems such as a music player, a video player, a communication device, and a personal computer may also be configured with burst-mode memories constructed in accordance with the disclosure.

The disclosure will now be summarized in the following series of clauses:

Clause 1. A burst-mode memory, comprising:
a plurality of columns, each column including a sense amplifier configured to sense a bit decision to drive a bit decision node and a complement bit decision node for the column;
an output data latch having a true input node and a complement input node; and
a column multiplexer having a plurality of pairs of pass transistors, each pair of pass transistors including a first pass transistor coupled between a respective column's bit decision node and the true input node and including a second pass transistor coupled between the respective column's complement bit decision node and the complement input node.

Clause 2. The burst-mode memory of clause 1, wherein each first pass transistor comprises an n-type metal-oxide semiconductor (NMOS) first pass transistor and each second pass transistor comprises an NMOS second pass transistor.

Clause 3. The burst-mode memory of any of clauses 1-2, wherein the output data latch comprises a pair of cross-coupled logic gates.

Clause 4. The burst-mode memory of clause 3, wherein the pair of cross-coupled logic gates comprises a pair of cross-coupled NAND gates.

Clause 5. The burst-mode memory of any of clauses 1-4, wherein the plurality of columns comprises at least four columns.

Clause 6. The burst-mode memory of any of clauses 1-5, wherein each a gate for each first pass transistor and a gate for each second pass transistor is configured to receive a decoded column address signal for the respective column.

Clause 7. The burst-mode memory of any of clause 1-6, wherein each sense amplifier comprises a latch.

Clause 8. The burst-mode memory of clause 7, wherein each latch comprises a pair of cross-coupled logic gates.

Clause 9. The burst-mode memory of clause 8, wherein each pair of cross-coupled logic gates comprises a pair of cross-coupled NAND gates.

Clause 10. The burst-mode memory of any of clause 1-9, further comprising:
a first scan-mode pass transistor coupled between a node for a scan-in data signal and the true input node; and
a second scan-mode pass transistor coupled between a node for a complement scan-in signal and the complement input node.

Clause 11. The burst-mode memory of any of clauses 1-10, further comprising:
a plurality of third transistors corresponding to the plurality of columns, each third transistor being coupled between a respective column's bit decision node and ground, wherein each third transistor is configured to be switched on during a power-on reset period.

Clause 12. The burst-mode memory of clause 11, wherein each third transistor is further configured to be switched on during a sleep mode of operation.

Clause 13. The burst-mode memory of any of clauses 1-11, wherein each column includes:
a true bit line;
a complement bit line;
a first charge-transfer transistor coupled between the true bit line and a first sense amplifier input node to the column's sense amplifier; and
a second charge-transfer transistor coupled between the complement bit line and a second sense amplifier input node to the column's sense amplifier.

Clause 14. A method for a burst-mode memory, comprising:
during a random-read operation to a plurality of columns, latching a bit signal and a complement bit signal in a sense amplifier in each column;
during a first burst-mode read operation to a first one of the columns following the random read operation, switching on a first pair of pass transistors to pass the bit signal from the first one of the columns to a true input node of an output data latch and to pass the complement bit signal from the first one of the columns to a complement input node of the output data latch; and latching the bit signal from the first one of the columns in the output data latch responsive to the switching on of the first pair of pass transistors.

Clause 15. The method of clause 14, further comprising:
asserting a first decoded address signal from a plurality of decoded address signals to switch on the first pair of pass transistors.

Clause 16. The method of any of clauses 14-15, further comprising;

during a second burst-mode read operation to a second one of the columns following the first burst-mode read operation, switching on a second pair of pass transistors to pass the bit signal from the second one of the columns to the true input node and to pass the complement bit signal from the second one of the columns to the complement input node; and latching the bit signal from the second one of the columns in the output data latch responsive to the switching on of the second pair of pass transistors.

Clause 17. The method of any of clauses 14-16, wherein the switching on of the first pair of pass transistors comprises switching on a first pair of NMOS pass transistors.

Clause 18. The method of any of clauses 14-17, wherein the latching of the bit signal from the first one of the columns in the output data latch comprises:

discharging the true input node responsive to the bit signal from the first one of the columns being a binary zero;

asserting an output signal from a first NAND gate responsive to the discharging of the true input node; and de-asserting an output signal from a second NAND gate responsive to the asserting of the output signal from the first NAND gate to form an output signal for the output data latch.

Clause 19. The method of any of clauses 14-17, wherein the latching of the bit signal from the first one of the columns in the output data latch comprises:

discharging the complement input node responsive to the bit signal from the first one of the columns being a binary one;

asserting an output signal from a first NAND gate responsive to the discharging of the complement input node; and de-asserting an output signal from a second NAND gate responsive to the asserting of the output signal from the first NAND gate, wherein the asserting of the output signal from the first NAND gate forms an output signal for the output data latch.

Clause 20. A burst-mode memory, comprising:
a first column having a first sense amplifier configured to sense a first bit signal and a complement first bit signal;
a second column having a second sense amplifier configured to sense a second bit signal and a second complement bit signal;
an output data latch having a true input node and a complement input node; and
a column multiplexer including a first pair of pass transistors configured to pass the first bit signal to the true input node and to pass the first complement bit signal to the complement input node in response to an assertion of a first decoded column address signal and including a second pair of pass transistors configured to pass the second bit signal to the true input node and to pass the second complement bit signal to the complement input node in response to an assertion of a second decoded column address signal.

Clause 21. The burst-mode memory of clause 20, wherein the output data latch comprises a pair of cross-coupled logic gates.

Clause 22. The burst-mode memory of clause 21, wherein the pair of cross-coupled logic gates comprises a pair of cross-coupled NAND gates.

Clause 23. The burst-mode memory of any of clauses 20-22, wherein the burst-mode memory is integrated with a cellular telephone.

Clause 24. The burst-mode memory of any of clauses 20-23, wherein the first pair of pass transistors and the second pair of pass transistors comprise NMOS pass transistors.

Clause 25. The burst-mode memory of any of clauses 20-24, further comprising:

a first transistor coupled between a node for the first bit signal and ground; and a second transistor coupled between a node for the second bit signal and ground, wherein the first transistor and the second transistor are configured to switch on during a power-on reset period.

As those of some skill in this art will by now appreciate and depending on the particular application at hand, many modifications, substitutions and variations can be made in and to the materials, apparatus, configurations and methods of use of the devices of the present disclosure without departing from the scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

What is claimed is:

1. A burst-mode memory, comprising:
a plurality of columns, each column including a bitcell coupled to a pair of bit lines through a pair of access transistors and a sense amplifier configured to latch a bit decision to drive a bit decision node and a complement bit decision node for the column;
a word line coupled to a gate of each access transistor, wherein the burst-mode memory is configured to not assert a voltage of the word line during a burst-mode read operation to keep each access transistor off during the burst-mode read operation;
an output data latch having a true input node and a complement input node; and
a column multiplexer having a plurality of pairs of pass transistors configured to be controlled by a corresponding plurality of decoded address signals during the burst-mode read operation, each pair of pass transistors including a first pass transistor coupled between a respective column's bit decision node and the true input node and having a gate coupled to a node for a corresponding decoded address signal from the plurality of decoded address signals, each pair of pass transistors also including a second pass transistor coupled between the respective column's complement bit decision node and the complement input node and having a gate coupled to the node for the corresponding decoded address signal from the plurality of decoded address signals.

2. The burst-mode memory of claim 1,
wherein each first pass transistor comprises an n-type metal-oxide semiconductor (NMOS) first pass transistor and each second pass transistor comprises an NMOS second pass transistor.

3. The burst-mode memory of claim 1, wherein the output data latch comprises a pair of cross-coupled logic gates.

4. The burst-mode memory of claim 3, wherein the pair of cross-coupled logic gates comprises a pair of cross-coupled NAND gates.

5. The burst-mode memory of claim 1, wherein the plurality of columns comprises at least four columns.

6. The burst-mode memory of claim 1, wherein each sense amplifier comprises a latch.

7. The burst-mode memory of claim 6, wherein each latch comprises a pair of cross-coupled logic gates.

8. The burst-mode memory of claim 7, wherein each pair of cross-coupled logic gates comprises a pair of cross-coupled NAND gates.

9. The burst-mode memory of claim 1, further comprising:
a first scan-mode pass transistor coupled between a node for a scan-in data signal and the true input node; and
a second scan-mode pass transistor coupled between a node for a complement scan-in signal and the complement input node.

10. The burst-mode memory of claim 1, further comprising:
a plurality of third transistors corresponding to the plurality of columns, each third transistor being coupled between a respective column's bit decision node and ground, wherein each third transistor is configured to be switched on during a power-on reset period.

11. The burst-mode memory of claim 10, wherein each third transistor is further configured to be switched on during a sleep mode of operation.

12. The burst-mode memory of claim 10, wherein each column includes:
a true bit line;
a complement bit line;
a first charge-transfer transistor coupled between the true bit line and a first sense amplifier input node to the column's sense amplifier; and
a second charge-transfer transistor coupled between the complement bit line and a second sense amplifier input node to the column's sense amplifier.

13. A method for a burst-mode memory, comprising:
during a random-read operation to a first column and to a second column, asserting a word line voltage to latch a first bit signal and a first complement bit signal in a first sense amplifier in the first column and to latch a second bit signal and a second complement bit signal in a second sense amplifier in the second column;
during a first burst-mode read operation in which the word line voltage is not asserted, coupling an asserted first decoded address signal to a gate of a first pass transistor in a first pair of pass transistors and to a gate of a second pass transistor in the first pair of pass transistors to switch on the first pair of pass transistors to pass the first bit signal from the first sense amplifier to a true input node of an output data latch and to pass the first complement bit signal from the first sense amplifier to a complement input node of the output data latch; and
latching the first bit signal in the output data latch responsive to the switching on of the first pair of pass transistors.

14. The method of claim 13, further comprising:
asserting a first decoded address signal from a plurality of decoded address signals to provide the asserted first decoded address signal.

15. The method of claim 13, further comprising:
during a second burst-mode read operation in which the word line voltage is not asserted following the first burst-mode read operation, coupling an asserted second decoded address signal to a gate of a first pass transistor in a second pair of pass transistors and to a gate of a second pass transistor in the second pair of pass transistors to switch on the second pair of pass transistors to pass the second bit signal from the second sense amplifier to the true input node and to pass the second complement bit signal to the complement input node; and
latching the second bit signal in the output data latch responsive to the switching on of the second pair of pass transistors.

16. The method of claim 13, wherein the switching on of the first pair of pass transistors comprises switching on a first pair of NMOS pass transistors.

17. The method of claim 13, wherein the latching of the first bit signal in the output data latch comprises:
discharging the true input node responsive to the first bit signal being a binary zero;
asserting an output signal from a first NAND gate responsive to the discharging of the true input node; and
de-asserting an output signal from a second NAND gate responsive to the asserting of the output signal from the first NAND gate to form an output signal for the output data latch.

18. The method of claim 13, wherein the latching of the first bit signal in the output data latch comprises:
discharging the complement input node responsive to the first bit signal from the first one of the columns being a binary one;
asserting an output signal from a first NAND gate responsive to the discharging of the complement input node; and
de-asserting an output signal from a second NAND gate responsive to the asserting of the output signal from the first NAND gate, wherein the asserting of the output signal from the first NAND gate forms an output signal for the output data latch.

19. A burst-mode memory, comprising:
a word line;
a first column having a first sense amplifier configured to latch a first bit signal and a complement first bit signal during a random-read operation in which a voltage of the word line is asserted;
a second column having a second sense amplifier configured to latch a second bit signal and a second complement bit signal during the random-read operation;
an output data latch having a true input node and a complement input node; and
a column multiplexer including a first pair of pass transistors, each pass transistor in the first pair of pass transistors having a gate coupled to a node for a first decoded column address signal, the first pair of pass transistors being configured to pass the first bit signal to the true input node and to pass the first complement bit signal to the complement input node in response to an assertion of the first decoded column address signal during a burst-mode read operation in which the voltage of the word line is not asserted and including a second pair of pass transistors, each pass transistor in the second pair of pass transistors having a gate coupled to a node for a second decoded column address signal, the second pair of pass transistors being configured to pass the second bit signal to the true input node and to pass the second complement bit signal to the complement input node in response to an assertion of the second decoded column address signal during the burst-mode read operation in which the voltage of the word line is not asserted.

20. The burst-mode memory of claim 19, wherein the output data latch comprises a pair of cross-coupled logic gates.

21. The burst-mode memory of claim 20, wherein the pair of cross-coupled logic gates comprises a pair of cross-coupled NAND gates.

22. The burst-mode memory of claim 19, wherein the burst-mode memory is integrated with a cellular telephone.

23. The burst-mode memory of claim 19, wherein the first pair of pass transistors and the second pair of pass transistors comprise NMOS pass transistors.

24. The burst-mode memory of claim 19, further comprising:
- a first transistor coupled between a node for the first bit signal and ground; and
- a second transistor coupled between a node for the second bit signal and ground, wherein the first transistor and the second transistor are configured to switch on during a power-on reset period.

* * * * *